United States Patent
Oh et al.

(10) Patent No.: US 8,760,942 B2
(45) Date of Patent: Jun. 24, 2014

(54) RESISTIVE MEMORY DEVICE CAPABLE OF BLOCKING A CURRENT FLOWING THROUGH A MEMORY CELL FOR FAST QUENCHING

(71) Applicant: Samsung Electronics Co., Ltd., Suwon-Si (KR)

(72) Inventors: Young Hoon Oh, Hwaseong-si (KR); Young Don Choi, Seoul (KR); Ick Hyun Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 20 days.

(21) Appl. No.: 13/762,428

(22) Filed: Feb. 8, 2013

(65) Prior Publication Data

US 2013/0208530 A1    Aug. 15, 2013

(30) Foreign Application Priority Data

Feb. 14, 2012  (KR) .......................... 10-2012-0014762

(51) Int. Cl.
 *G11C 7/22* (2006.01)
(52) U.S. Cl.
 USPC ................... 365/189.16; 365/194; 365/225.7; 365/148; 365/163; 365/230.03; 365/230.06

(58) Field of Classification Search
 USPC .............. 365/148, 158, 163, 230.03, 230.06, 365/189.16, 194, 225.7
 See application file for complete search history.

(56) References Cited

U.S. PATENT DOCUMENTS

| | | | |
|---|---|---|---|
| 7,626,860 B2 | 12/2009 | Lamorey et al. | |
| 7,639,522 B2 * | 12/2009 | Cho et al. ...................... | 365/148 |
| 7,778,064 B2 | 8/2010 | Parkinson et al. | |
| 7,869,268 B2 | 1/2011 | Giovinazzi et al. | |
| 8,159,869 B2 * | 4/2012 | Park et al. ...................... | 365/163 |
| 2010/0046286 A1 | 2/2010 | Choi | |

FOREIGN PATENT DOCUMENTS

| | | |
|---|---|---|
| KR | 20100022784 A | 3/2010 |
| KR | 20100022788 A | 3/2010 |
| WO | WO2008035392 A1 | 3/2008 |

* cited by examiner

*Primary Examiner* — Andrew Q Tran
(74) *Attorney, Agent, or Firm* — Volentine & Whitt, PLLC (57) ABSTRACT

A resistive memory device includes a plurality of first switches that connect word lines to a ground line in response a first switch control signal and a plurality of second switches that connect a plurality of global bit lines to a plurality of local bit lines corresponding to the plurality of global bit lines in response to a second switch control signal.

18 Claims, 12 Drawing Sheets

RESISTIVE MEMORY DEVICE CAPABLE OF BLOCKING A CURRENT FLOWING THROUGH A MEMORY CELL FOR FAST QUENCHING

CROSS-REFERENCE TO RELATED APPLICATIONS

This application claims the benefit of Korean Patent Application No. 10-2012-0014762 filed on Feb. 14, 2012, the subject matter of which is hereby incorporated by reference.

BACKGROUND

The inventive concept relates to resistive memory devices, and more particularly, to resistive memory devices capable of providing an improved fast quenching operation that results in improved distribution of constituent resistive memory cells. The inventive concept also relates to operating methods and memory systems including the resistive memory device.

Examples of non-volatile memory devices using a resistance material include phase change random access memory (PRAM), resistive RAM (RRAM), magnetic RAM (MRAM), and so on. A resistance value of a memory element included in a resistive memory cell of a non-volatile memory device using a resistance material varies according to a level of program current supplied to the memory element. Thus, the resistive memory cell stores information by using the difference between resistance values of the memory element. For example, in the case of a phase change memory, the difference between resistance values of a memory element therein is caused by a phase change in a phase-change material used to form the phase change memory.

However, as the capacities and integration degrees of non-volatile memory devices have increased, resistance values of variable resistors (resistor-capacitor (RC)) have increased at data lines. Thus, after switches connected to local bit lines are turned off, it takes a large amount of time to reduce a level of current flowing through memory cells. Accordingly, there is a need to develop a method of rapidly reducing a level of current flowing through memory cells.

SUMMARY

According to an aspect of the inventive concept, there is provided a resistive memory device comprising; a memory cell array including a plurality of resistive memory cells arranged in accordance with a plurality of local bit lines, and each being respectively connected to one of a plurality of global bit lines and a plurality of word lines, and a write driver that selectively supplies current to the plurality of resistive memory cells corresponding to the plurality of local bit lines, via the plurality of global bit lines. The memory cell array comprises a plurality of first switches that connect the plurality of word lines to a ground line in response to a first switch control signal, and a plurality of second switches that connect the plurality of global bit lines to the plurality of local bit lines corresponding to the plurality of global bit lines in response to a second switch control signal, wherein opposing first and second ends of the plurality of resistive memory cells connected between the write driver and the ground line are disconnected from the write driver and the ground line in response to the first and second switch control signals.

According to another aspect of the inventive concept, there is provided a memory system comprising; a resistive memory device, and a processor that controls operation of the resistive memory device, wherein the resistive memory device comprises a memory cell array including a plurality of resistive memory cells arranged in accordance with a plurality of local bit lines, and each being respectively connected to one of a plurality of global bit lines and a plurality of word lines, and a write driver that selectively supplies current to the plurality of resistive memory cells corresponding to the plurality of local bit lines, via the plurality of global bit lines. The memory cell array comprises a plurality of first switches that connect the plurality of word lines to a ground line in response to a first switch control signal, and a plurality of second switches that connect the plurality of global bit lines to the plurality of local bit lines corresponding to the plurality of global bit lines in response to a second switch control signal, wherein first and second ends of the plurality of resistive memory cells connected between the write driver and the ground line are disconnected from the write driver and the ground line according to the first and second switch control signals.

According to another aspect of the inventive concept, there is provided a method of operating a resistive memory device including a plurality of resistive memory cells arranged at intersections of a plurality of local bit lines each being connected to one of a plurality of global bit lines and a plurality of word lines, the method comprising; forming a current path from a write driver to the plurality of resistive memory cells and then to a ground line by supplying a current to a global bit line and a local bit line corresponding to a resistive memory cell selected from among the plurality of resistive memory cell by using the write driver, and then disconnecting first and second ends of the plurality of resistive memory cells from the write driver and the ground line.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Embodiments of the inventive concept will now be described in some additional detail with reference to the accompanying drawings. This inventive concept may, however, be embodied in many different forms and should not be construed as being limited to only the illustrated embodiments. Rather, these embodiments are provided so that this disclosure will be thorough and complete, and will fully convey the scope of the invention to those skilled in the art. Throughout the written description and drawings, like reference numbers and labels denote like or similar elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined.

Figure 1:
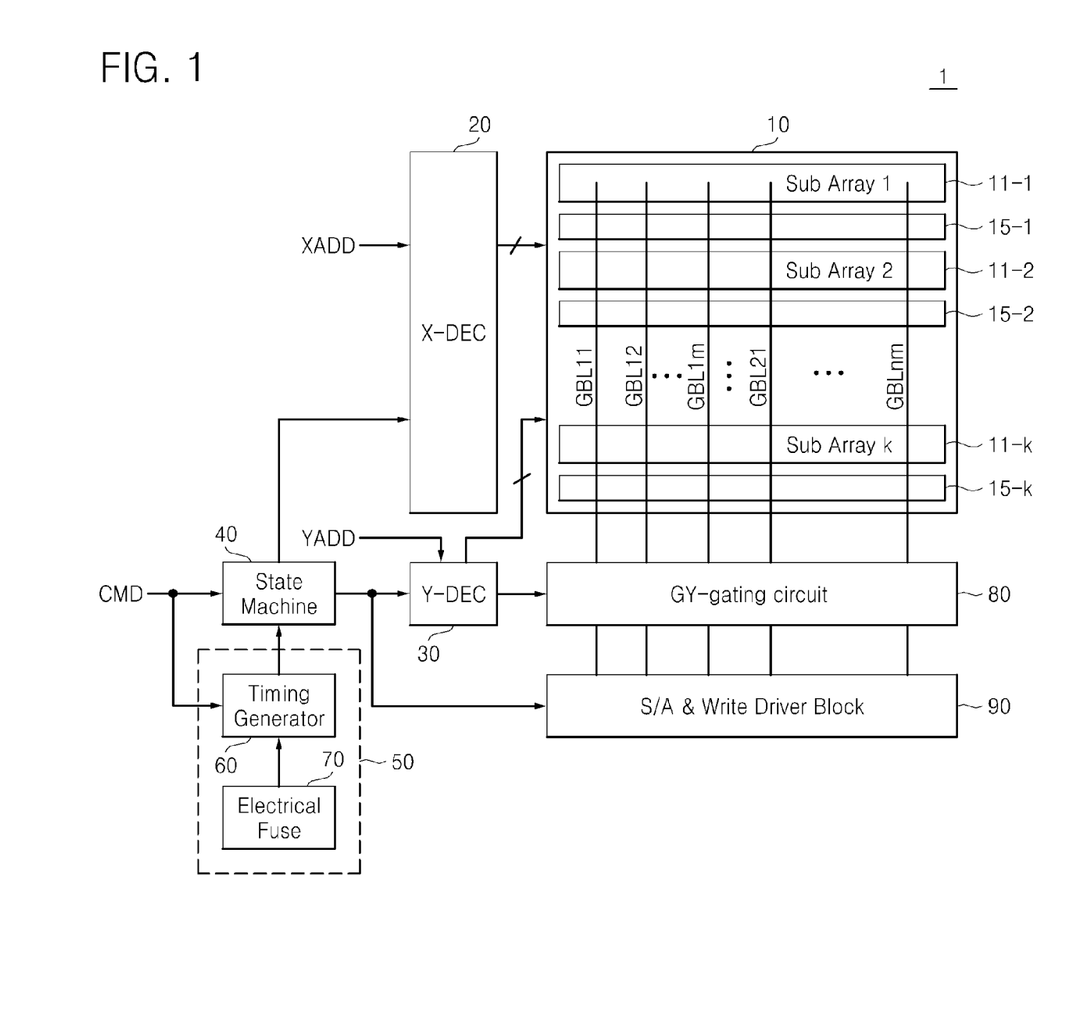
FIG. 1 is a block diagram of a resistive memory device according to an embodiment of an inventive concept.
Figure 2:
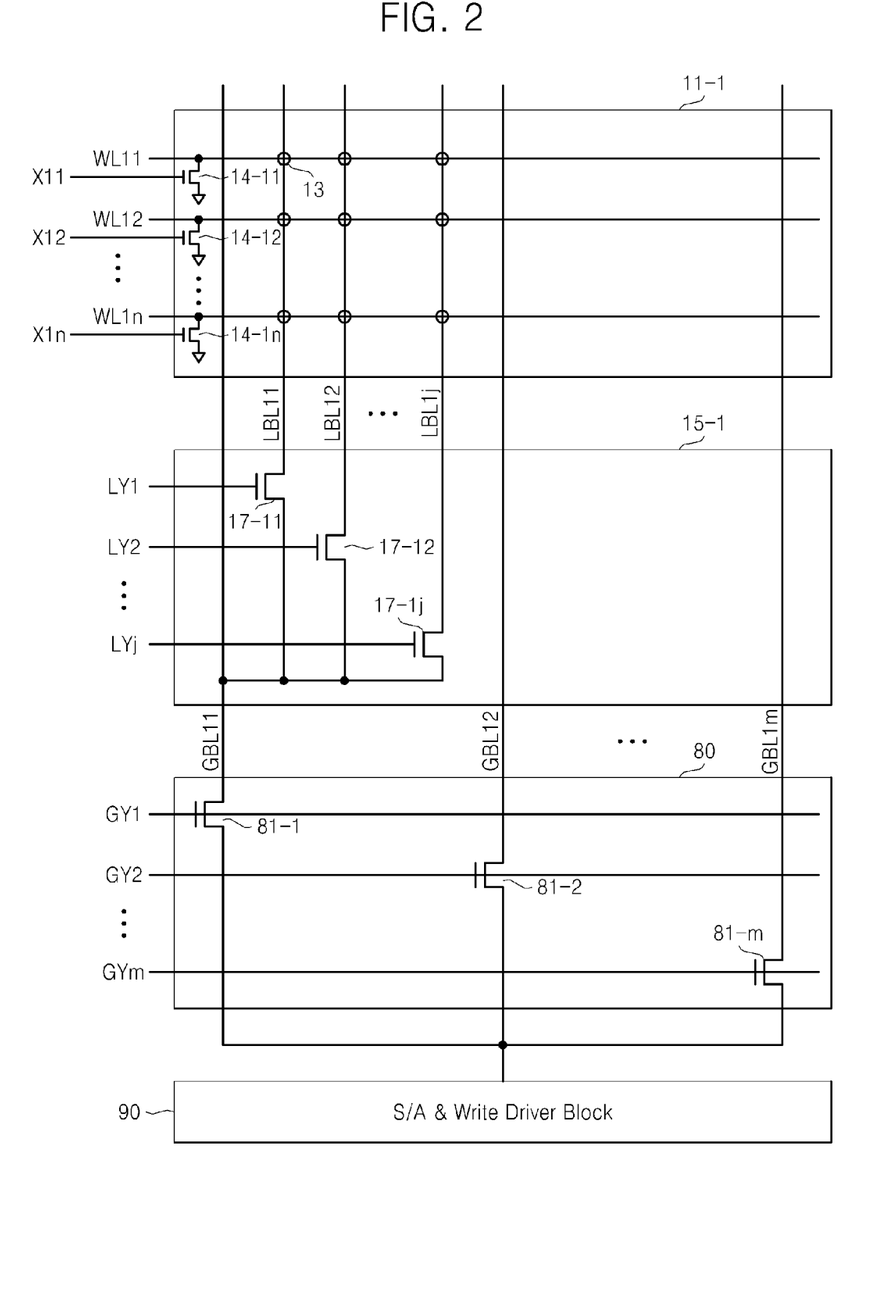
FIG. 2 is a circuit diagram for explaining an operation of the resistive memory device of FIG. 1, according to an embodiment of the inventive concept.

Figure (FIG.) 1 is a block diagram illustrating a resistive memory device 1 according to an embodiment of an inventive concept. FIG. 2 is a circuit diagram further illustrating one exemplary operating method for the resistive memory device 1 of FIG. 1. The illustrated embodiments described hereafter it is assumed for convenience of explanation that the resistive memory device 1 is a phase change random access memory (PRAM), but the scope of the inventive concept is not limited thereto. For example, those skilled in the art will understand that the resistive memory device 1 may be a magnetic RAM (MRAM), a resistive RAM (RRAM), or the like.

Referring to FIGS. 1 and 2, the resistive memory device 1 generally comprises in relevant portion a memory cell array 10, a row decoder 20, a column decoder 30, a state machine 40, a timing controller 50, a Y-gating circuit 80, and a sense amplifier (S/A) & write driver block 90.

The memory cell array 10 includes a plurality of global bit lines GBL11 to GBLnm, a plurality of sub cell arrays 11-1 to 11-k, and a plurality of local bit line selection circuits 15-1 to 15-k, where 'n', 'm', and 'k' respectively denote a natural number.

Each one of the plurality of sub cell arrays 11-1 to 11-k may be implemented with substantially the same structure. Therefore the structure and operation of a first sub cell array 11-1 will be described as an example of all other sub cell arrays in the plurality of sub cell arrays 11-1 to 11-k. The first sub cell array 11-1 includes a plurality of resistive memory cells 13 respectively arranged at the intersections of a plurality of local bit lines LBL11 to LBL1j and a plurality of word lines WL11 to WL1n, where T denotes a natural number, and a plurality of first switches 14-11 to 14-1n corresponding to the plurality of word lines WL11 to WL1n. The plurality of first switches 14-11 to 14-1n connect the plurality of word lines WL11 to WL1n to ground via a respective a plurality of word line selection signals X11 to X1n.

For example, when a selection signal apparent on the word line selection signal X11 is held logically "high" and applied to the first switch 14-11, the word line WL11 is discharged to ground. In certain embodiments, each of the plurality of first switches 14-11 to 14-1n may be embodied as an NMOS transistor but is not limited thereto.

Each one of the plurality of local bit line selection circuits 15-1 to 15-k may have substantially the same structure, and the structure and operation of a first local bit line selection circuit 15-1 will be described as an example of the other local bit line selection circuits 15-1 to 15-k.

The first local bit line selection circuit 15-1 includes a plurality of second switches 17-11 to 17-1j that respectively connect the plurality of local bit lines LBL11 to LBL1j to the first global bit line GBL11 according to a plurality of local bit line selection signals LY1 to LYj received from the column decoder 30.

For example, when a selection signal apparent on the local bit line selection signal LY1 is held high and applied to the second switch 17-11, the local bit line LBL11 is discharged to a voltage of the global bit line GBL11. In this case, each of the plurality of second switches 17-11 to 17-1j may be embodied as an NMOS transistor but is not limited thereto.

Each of the plurality of resistive memory cells 13 is capable of storing data using the material properties of a phase-change material, e.g., GST(Ge—Sb—Te), and generally includes a memory element and a selection element. That is, a phase-change material having a two stable states,(e.g., a crystalline state and an amorphous state) may be programmed by controlled application of thermal energy to store binary data ('1' and '0').

Figure 3:
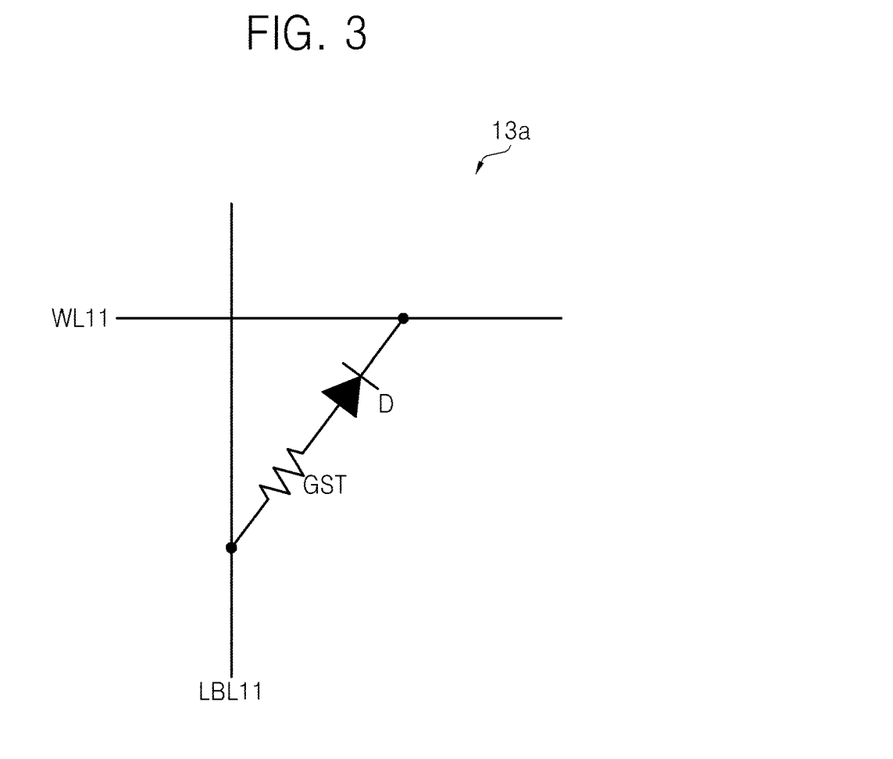
FIG. 3 is a circuit diagram of a resistive memory cell of FIG. 2 according to an embodiment of the inventive concept.

FIG. 3 is an equivalent circuit diagram for the resistive memory cell 13a illustrated in FIG. 2 according to an embodiment of the inventive concept. Referring to FIGS. 2 and 3, the resistive memory cell 13a may include a phase-change material and a diode D connected in series between a bit line LBL11 and a word line WL11. With this configuration, the phase-change material may be used as a memory element and the diode D is used as a selection element. In other words, an anode of the diode D is connected to the memory element and a cathode of the diode D is connected to the word line WL11.

Thus, when a voltage difference between the anode and cathode of the diode D is higher than a threshold voltage of the diode D, a selected program current, (e.g., a set current ISET or a reset current IRST), may be supplied to the memory element via the bit line LBL11.

Figure 4:
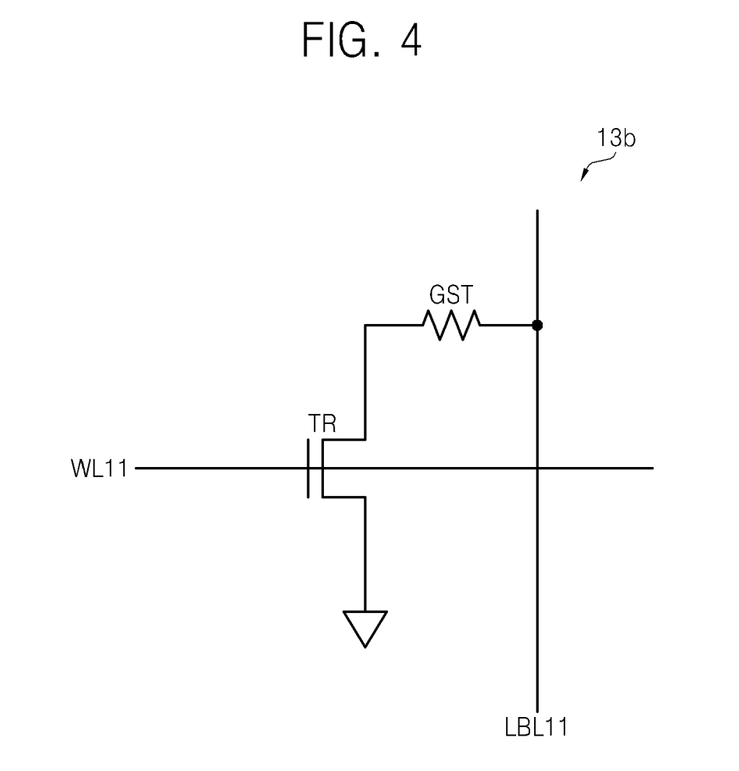
FIG. 4 is a circuit diagram of a resistive memory cell of FIG. 2 according to another embodiment of the inventive concept.

FIG. 4 is an equivalent circuit diagram for the resistive memory cell 13b illustrated in FIG. 2 according to another embodiment of the inventive concept. Referring to FIGS. 2 and 4, the resistive memory cell 13b includes a phase-change material (GST) and a transistor TR connected in series between a bit line LBL11 and a power supply line, e.g., a ground line applying a ground voltage or a power supply line for applying a constant voltage. In this case, the phase-change material may be used as a memory element, and the transistor TR is used as a selection element. For example, when a voltage applied to a word line WL11 is higher than a threshold voltage of the transistor TR, then a selected program current, (e.g., the set current ISET or reset current IRST), may be supplied to the memory element GST of the resistive memory cell 13b via the bit line LBL11.

Referring back to FIGS. 1 and 2, the row decoder 20 may be used to decode an externally provided row addresses (XADD) and selectively drive one of the plurality of word lines WL11 to WL1n included in the memory cell array 10 in response to the decoded row address. The row decoder 20 may also be used to control operation of the plurality of first switches 14-11 to 14-1n through the plurality of word line selection signals X11 to X1n as indicated by control signals and/or commands provided by the state machine 40.

The column decoder 30 may similarly be used to decode an externally provided column address (YADD) and selectively drive one of the plurality of local bit lines LBL11 to LBL1j and one of the plurality of global bit lines GBL11 to GBLnm in response to the decoded column address. The column decoder 30 may also be used to control operation of the plurality of second switches 17-11 to 17-1j according to the plurality of local bit line selection signals LY1 to LYj received from the state machine 40, and to control operation of a plurality of third switches 81-1 to 81-m according to a plurality of global bit line selection signals GY1 to GYm received from the state machine 40.

In this regard, the state machine 40 may be used to generate the plurality of word line selection signals X11 to X1n, the plurality of local bit line selection signals LY1 to LYj, and the plurality of global bit line selection signals GY1 to GYm in response to an externally provided command (CMD) and a corresponding delayed command received from the timing controller 50. As will be appreciated by those skilled in the art, the command may be a variously defined program command or read command, as examples.

The timing controller 50 may be used to adjust a timing skew (or delay period) between the externally provided command and the delayed command. In certain embodiments, the timing controller 50 may include a timing generator 60 together with an electrical fuse 70.

In one particular embodiment, the timing generator 60 delays the externally provided command according to selection signals received from the electrical fuse 70 and then transmits the resulting delayed command to the state machine 40. One possible example of the timing generator 60 is illustrated in FIG. 5.

Figure 5:
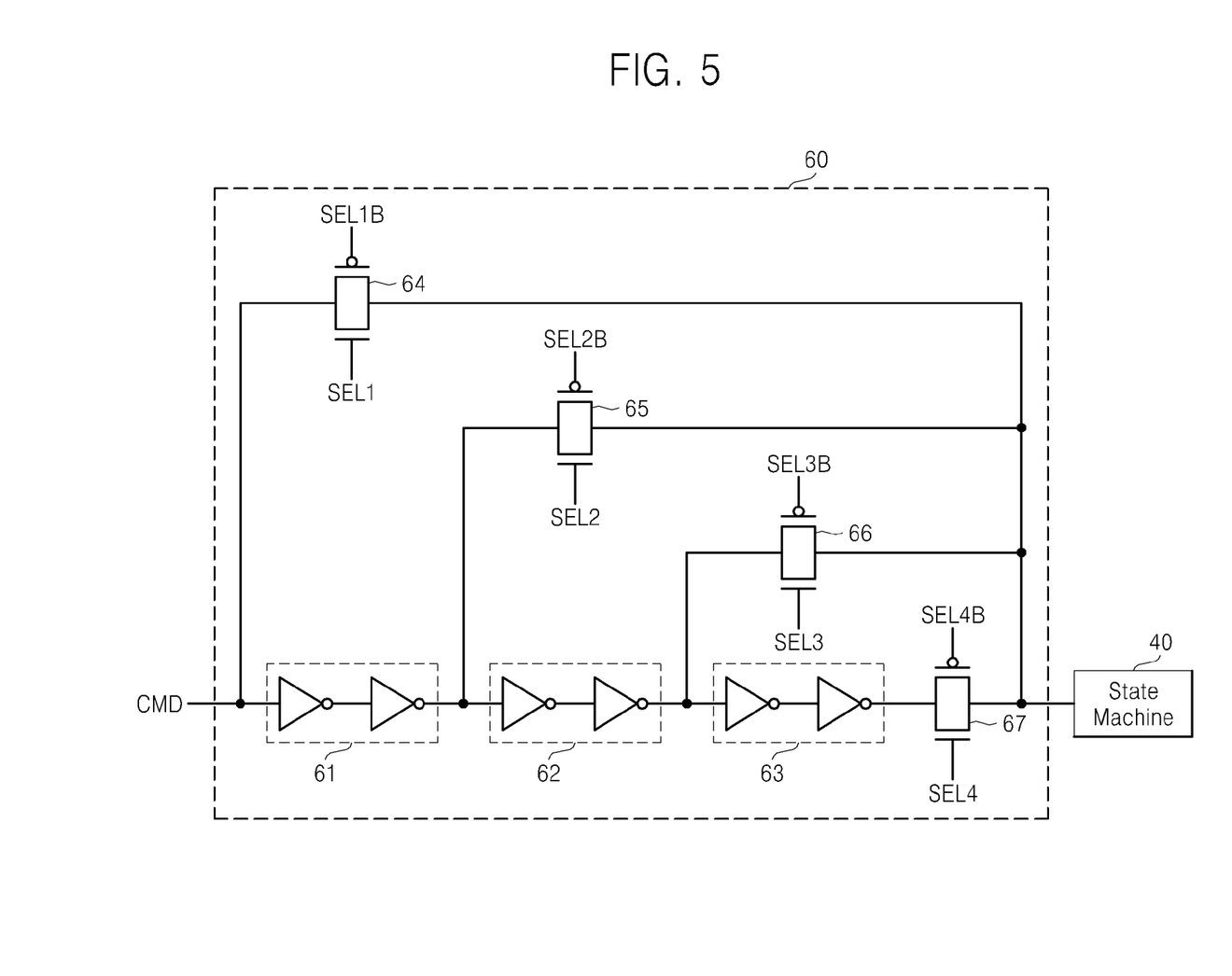
FIG. 5 is a circuit diagram of a timing generator of FIG. 1 according to an embodiment of the inventive concept.

Thus, FIG. 5 is a circuit diagram illustrated in relevant portion the timing generator 60 of FIG. 1 according to an embodiment of the inventive concept. Referring to FIG. 5, the timing generator 60 comprises first, second and third delay units 61, 62 and 63, and first through fourth pass gates 64 to 67.

Each of the first, second and third delay units 61, 62 and 63 may be implemented using one or more inverter elements to apply a specific delay period to the externally provided command in order to generate the delayed command.

The first through fourth pass gates 64 to 67 may be activated or deactivated (hereafter, "activate/deactivate") according to first through fourth selection signals SEL1 to SEL4 and inverted first through fourth selection signals SEL1B to SEL4B, respectively. With this configuration, only one of the first through fourth pass gates 64 to 67 will be activated according to the first to fourth selection signals SEL1 to SEL4 and the inverted first to fourth selection signals SEL1B to SEL4B.

In the illustrated example of FIG. 5, when the first pass gate 64 is activated according to the first selection signal SEL1 and the inverted first selection signal SEL1B, the externally provided command (CMD) is directly applied without material delay period to the state machine 40. In contrast, when the fourth pass gate 67 is activated according to the fourth selection signal SEL4 and the inverted fourth selection signal SEL4B, the externally provided command (CMD) is sequentially delayed by the first, second and third delay units 61, 62 and 63 before being applied to the state machine 40.

In the illustrated embodiment of FIG. 5, the timing generator 60 includes four (4) pass gates, but the inventive concept is not limited thereto.

Referring collectively to FIGS. 1, 2, and 5, the electrical fuse 70 supplies the selection signals SEL1 to SEL4 and the inverted selection signals SEL1B to SEL4B for adjusting the timing skew between the plurality of word line selection signals X11 to X1n and the plurality of local bit line selection signals LY1 to LYj, to the timing generator 60. The timing generator 60 delays the externally provided command (CMD) and transmits the delayed command to the state machine 40 according to the selection signals SEL1 to SEL4 and the inverted selection signals SEL1B to SEL4B.

In other words, the state machine 40 may control the activation timing of the plurality of first switches 14-11 to 14-1n and the plurality of second switches 17-11 to 17-1j in response to the externally provided command (CMD) and the delayed command CMD as provided by the timing controller 50 in order to generate the plurality of word line selection signals X11 to X1n, the plurality of local bit line selection signals LY1 to LYj, and the plurality of global bit line selection signals GY1 to GYm.

The Y-gating circuit 80 controls connection(s) between the memory cell array 10 and the S/A & write driver block 90 according to each of the plurality of global bit line selection signals GY1 to GYm received from the column decoder 30.

The S/A & write driver block 90 supplies write data to the Y-gating circuit 80 during a write operation, and senses and amplifies read data received from the Y-gating circuit 80 during a read operation.

Figure 6:
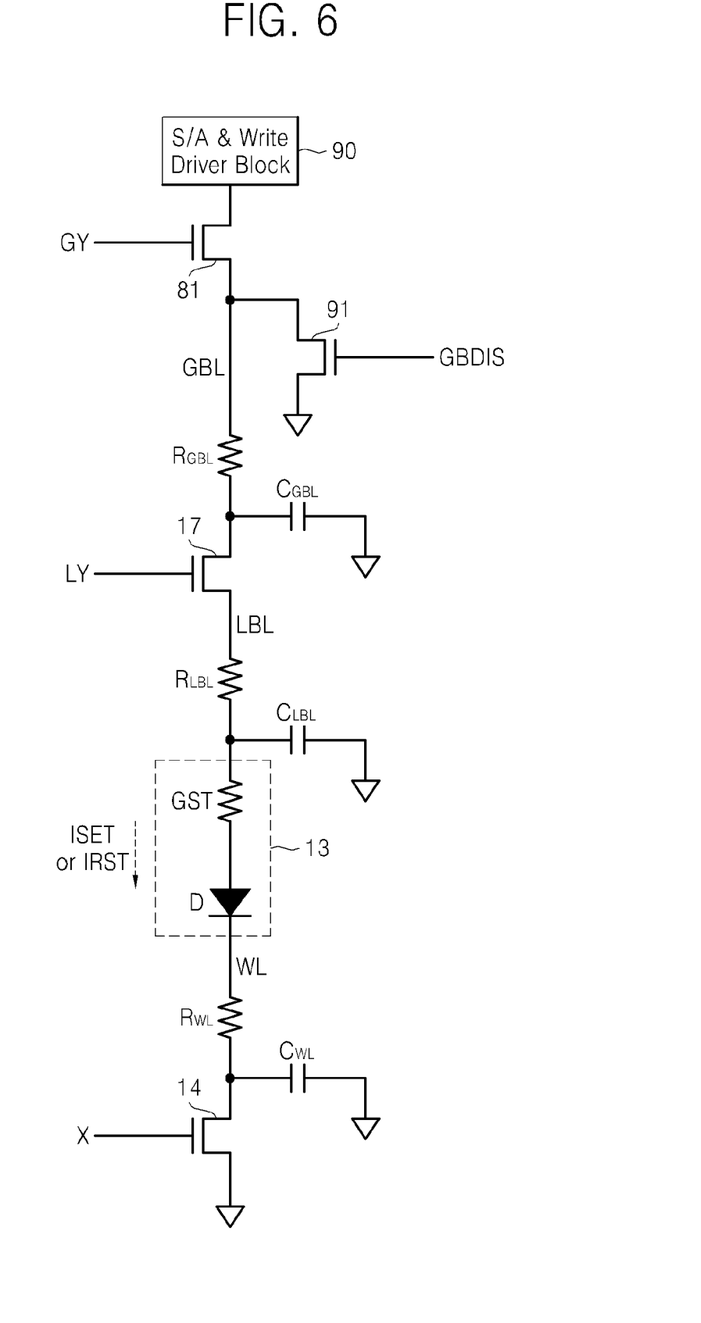
FIG. 6 is a circuit diagram of a resistive memory cell of FIG. 2 connected between a local bit line and a word line according to an embodiment of the inventive concept.
Figure 7:
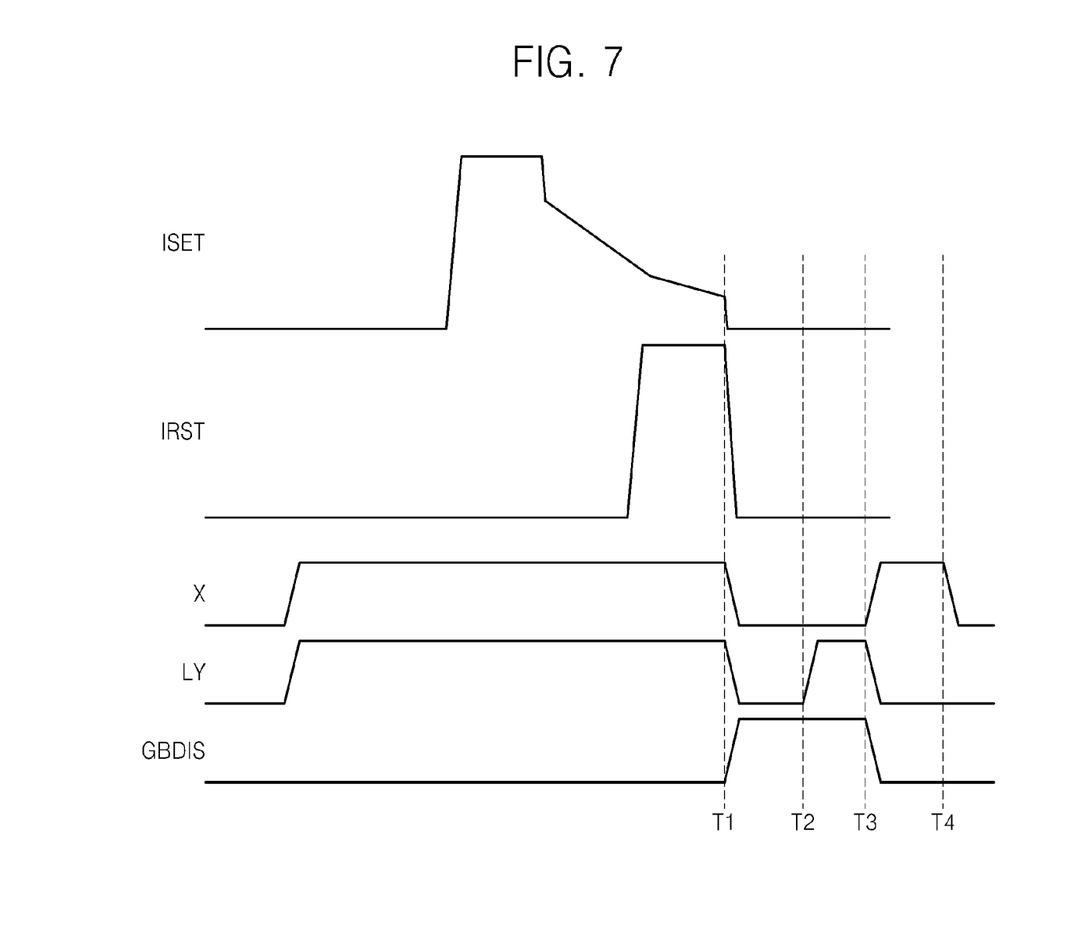
FIG. 7 is a timing diagram illustrating an operating method for the resistive memory cell of FIG. 6 according to an embodiment of the inventive concept.

FIG. 6 is a circuit diagram illustrating one of the plurality of resistive memory cells 13 of FIG. 2, connected between a local bit line LBL and a word line WL, according to an embodiment of the inventive concept. FIG. 7 is a timing diagram illustrating an exemplary operation of the resistive memory cell 13 of FIG. 6 according to an embodiment of the inventive concept. For convenience of explanation, FIG. 6 illustrates only the local bit line LBL and the word line WL corresponding to one resistive memory cell 13.

Also, FIG. 6 illustrates a circuit obtained by modeling the resistive memory cell 13 connected between an S/A & write driver block 90 and a ground. In the circuit of FIG. 6, variable resistors $R_{GBL}$ and $C_{GBL}$ corresponding to a global bit line GBL, variable resistors $R_{LBL}$ and $C_{LBL}$ corresponding to a local bit line LBL, and variable resistors $R_{WL}$ and $C_{WL}$ corresponding to a word line WL may illustrated.

In the illustrated example, it requires a relatively large amount of time to reduce a level of current flowing through the resistive memory cell 13 due to resistance values of the variable resistors RC increases. However, according to certain embodiment of the inventive concept, a phase-change material (GST) may be fast quenched by blocking current flowing through the resistive memory cell 13. To this end, referring collectively to FIGS. 1 to 7, a fourth switch 91 may further included to connect the global bit line GBL and ground, wherein the fourth switch 91 is controlled by a discharge enable signal GBDIS. In certain embodiments of the inventive concept, the fourth switch 91 may be included in the S/A & write driver block 90.

As noted above, the resistive memory cell 13 may be connected between the local bit line LBL and the word line WL to be supplied with the set current ISET or reset current IRST from the S/A & write driver block 90 via the local bit line LBL.

In the working example, the set current ISET is a current that causes the phase-change material GST included in the resistive memory cell 13 to have a crystalline state, and the reset current IRST is a current that causes the phase-change material GST to have an amorphous state. The resistance value of the resistive memory cell 13 is greater when the phase-change material GST has the amorphous state than when the phase-change material GST has the crystalline state. Thus, the phase-change material GST may be used to store data according to the resistance value differences of the resistive memory cell 13.

In order to change the phase-change material GST to have the amorphous state, the phase-change material GST is heated to a temperature higher than the melting temperature using the reset current IRST supplied via the local bit line LBL and then be fast quenched.

To this end, as illustrated in FIGS. 6 and 7, at a first time T1, a first switch 14 and a second switch 17 are simultaneously turned OFF according to a word line selection signal X and a local bit line selection signal LY, respectively, and the fourth switch 91 is turned ON according to the discharge enable signal GBDIS.

In this case, the timing controller 50 may adjust timing skew between the word line selection signal X and the local bit line selection signal LY to turn OFF the first switch 14 and the second switch 17 at the same time.

In other words, when the first switch 14 and the second switch 17 are turned OFF at the same time, the resistive memory cell 13 is disconnected from the S/A & write driver block 90 and a ground line. Thus, a level of the reset current IRST flowing through the resistive memory cell 13 is lowered and the resistance value of the phase-change material GST increases.

After the first switch 14 and second switch 17 are turned OFF, at a second time T2, the second switch 17 is turned ON according to the local bit line selection signal LY. That is, when the local bit line selection signal LY that has a logic high level is input to the second switch 17, the local bit line LBL is discharged to a voltage of the global bit line GBL.

At time T3, the first switch 14 is turned ON according to the word line selection signal X, the second switch 17 is turned OFF according to the local bit line selection signal LY, and the fourth switch 91 is turned OFF according to the discharge enable signal GBDIS. In other words, if a high word line selection signal X is applied to the first switch 14 and a low local bit line selection signal LY is applied to the second switch 17, then the word line WL is discharged to ground.

Figure 8:
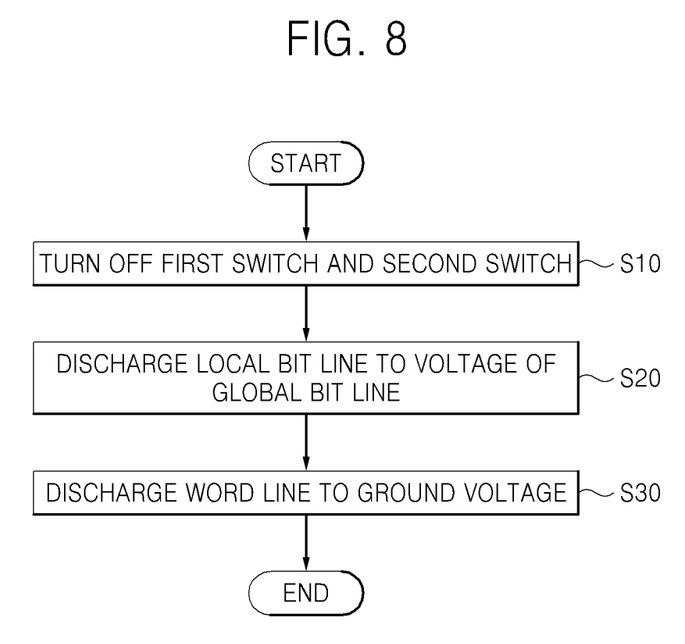
FIG. 8 is a flowchart summarizing an operating method for a resistive memory device according to an embodiment of the inventive concept.

FIG. 8 is a flowchart summarizing an operating method for a resistive memory device according to an embodiment of the inventive concept. Referring collectively to FIGS. 1 to 8, in the resistive memory cell 13 connected between the local bit line LBL and the word line WL, the first switch 14 and the second switch 17 are respectively turned OFF at the same time according to the word line selection signal X and the local bit line selection signal LY received from the state machine 40 under control of the timing controller 50 (S10).

After the first switch 14 and the second switch 17 are turned OFF, when the second switch 17 is turned ON according to the local bit line selection signal LY generated by the state machine 40, the local bit line LBL is discharged to a voltage of the global bit line GBL (S20).

Then, when the turned ON second switch 17 is turned OFF, and at the same time, the first switch 14 is turned ON according to the word line selection signal X generated by the state machine 40, the word line WL is discharged to a ground voltage (S30).

Thus, when the resistive memory device 1 is reset, reset current IRST flowing through the resistive memory cell 13 is temporarily blocked and the local bit line LBL is first discharged to the voltage of the global bit line GBL. Accordingly, an improved fast-quenching method may be employed without influencing the distribution of the resistive memory cell 13 of the resistive memory device 1.

Figure 9:
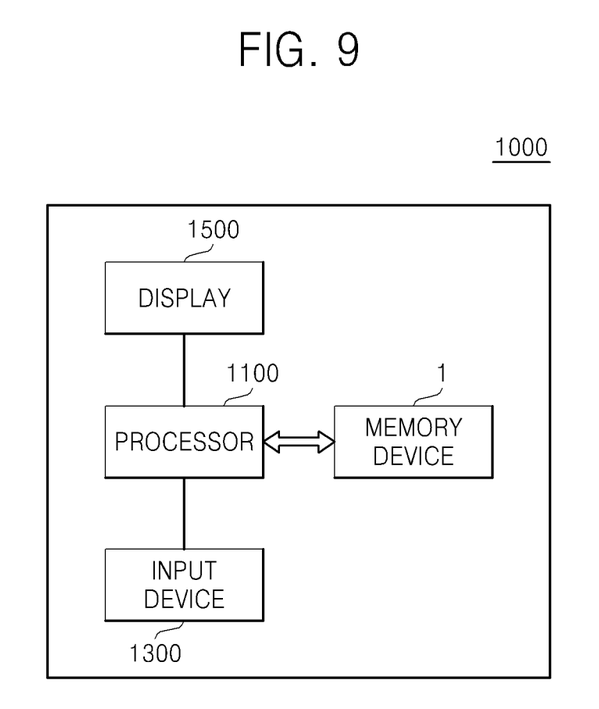
FIG. 9 is a block diagram of a memory system including the resistive memory device illustrated in FIG. 1 according to some embodiments of the inventive concept.

FIG. 9 is a block diagram of a memory system 1000 that may incorporate a resistive memory device like the one described in relation to FIG. 1 according to certain embodiments of the inventive concept. The memory system 1000 may be implemented as a data processing device like a tablet computer, a net-book, an e-reader, a personal digital assistant (PDA), a portable multimedia player (PMP), an MP3 player, a mobile phone, a smart phone, a wireless internet device or an MP4 player.

The memory system 1000 includes the resistive memory device 1 storing program bits and a processor 1100 controlling the data processing operations of the resistive memory device 1.

The processor 1100 may display data stored in the resistive memory device 1 through a display 1500 according to signal input through an input device 1300. The input device 1300 may be implemented by a pointing device such as a touch pad or a computer mouse, a keypad, or a keyboard.

Figure 10:
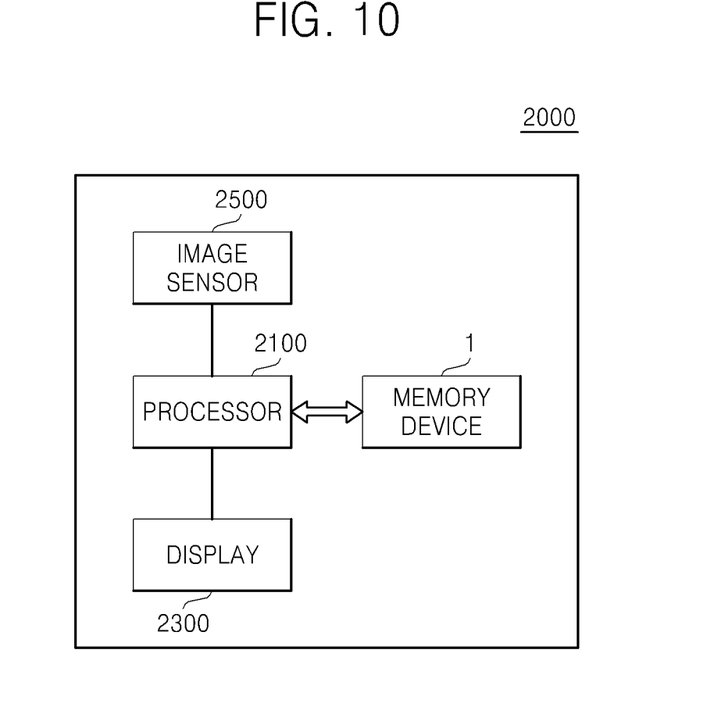
FIG. 10 is a block diagram of a memory system including the resistive memory device illustrated in FIG. 1 according to other embodiments of the inventive concept.

FIG. 10 is a block diagram of a memory system 2000 that may incorporate a resistive memory device like the one illustrated in FIG. 1 according to other embodiments of the inventive concept. The memory system 2000 may be implemented as a digital camera, or a mobile phone equipped with a digital camera.

The memory system 2000 includes the resistive memory device 1 storing program bits and a processor 2100 controlling the data processing operations of the resistive memory device 1. An image sensor 2500 included in the memory system 2000 converts optical images into digital signals and the digital signals may be controlled by the processor 2100 to be displayed through a display 2300 or stored in the resistive memory device 1.

Figure 11:
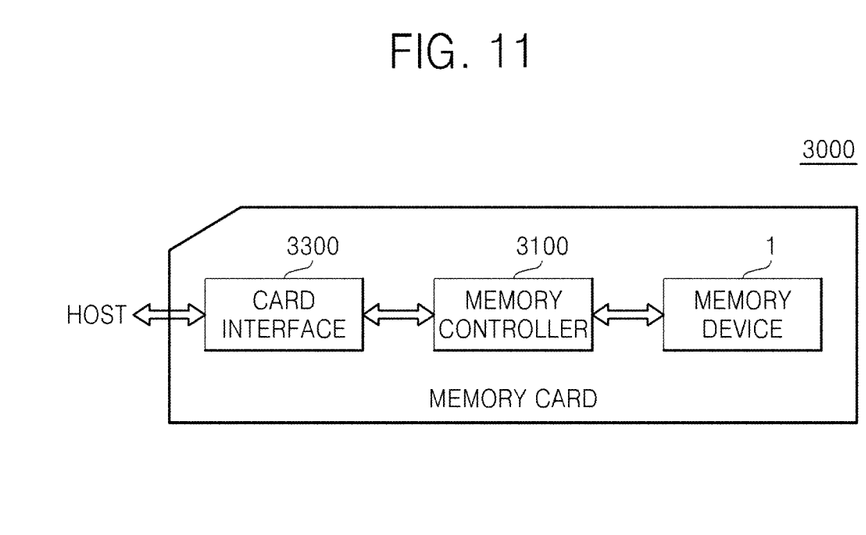
FIG. 11 is a block diagram of a memory system including the resistive memory device illustrated in FIG. 1 according to further embodiments of the inventive concept.

FIG. 11 is a block diagram of a memory system 3000 that may incorporate a resistive memory device 1 like the one illustrated in FIG. 1 according to further embodiments of the inventive concept. The memory system 3000 is implemented as a memory card or a smart card. The memory system 3000 includes the resistive memory device 1, a memory controller 3100, and a card interface 3300.

The memory controller 3100 may control data exchange between the resistive memory device 1 and the card interface

3300. The card interface 3300 may be a secure digital (SD) card interface or a multi-media card (MMC) interface, but the inventive concept is not restricted to the current embodiments. The card interface 3300 may interface a host and the memory controller 3100 for data exchange according to a protocol of the host.

When the memory system 3000 is connected with the host such as a PC, a tablet PC, a digital camera, a digital audio player, a cellular phone, a console video game hardware, or a digital set-top box, the host may perform data communication with the resistive memory device 1 through the card interface 3300 and the memory controller 3100.

Figure 12:
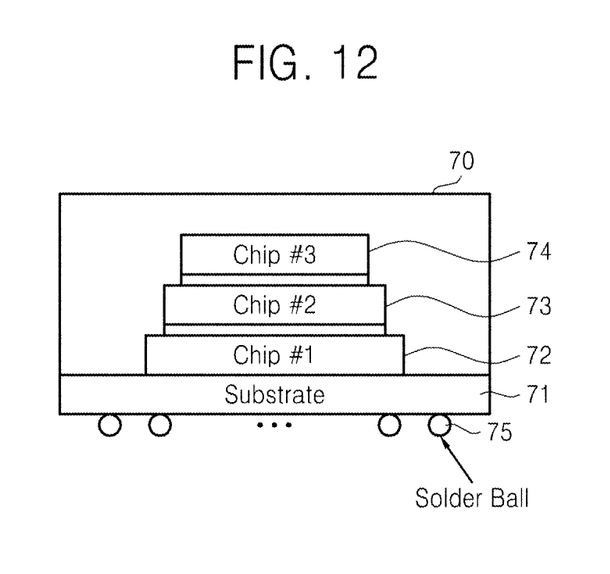
FIG. 12 is a schematic diagram of a multi-chip package including a plurality of semiconductor devices according to some embodiments of the inventive concept.

FIG. 12 is a schematic diagram of a multi-chip package 70 including a plurality of semiconductor devices 72, 73, and 74 according to some embodiments of the inventive concept. Referring to FIG. 12, the multi-chip package 70 may include a plurality of the semiconductor devices, i.e., first through third chips 72, 73, and 74 which are sequentially stacked on a package substrate 71. Each of the semiconductor devices 72 through 74 may be the processor, the memory controller, or the memory device that has been described above. The memory device may be a resistive memory device 1, but not restricted there-to. The memory device may be a volatile or non-volatile memory device. A through-silicon via (TSV) (not shown), a bonding wire (not shown), a bump (not shown), or a solder ball 75 may be used to electrically connect the semiconductor devices 72 through 74 with one other.

A resistive memory device according to an embodiment of the inventive concept is capable of improving the distribution of memory cell by blocking current flowing through a memory cell so as to fast quenching a phase-change material memory cell.

While the inventive concept has been particularly shown and described with reference to exemplary embodiments thereof, it will be understood by those of ordinary skill in the art that various changes in forms and details may be made therein without departing from the scope of the inventive concept as defined by the following claims.

What is claimed is:

1. A resistive memory device comprising:
   a memory cell array including a plurality of resistive memory cells arranged in accordance with a plurality of local bit lines, and each being respectively connected to one of a plurality of global bit lines and a plurality of word lines; and
   a write driver that selectively supplies current to the plurality of resistive memory cells corresponding to the plurality of local bit lines, via the plurality of global bit lines,
   wherein the memory cell array comprises:
   a plurality of first switches that connect the plurality of word lines to a ground line in response to a first switch control signal, and a plurality of second switches that connect the plurality of global bit lines to the plurality of local bit lines corresponding to the plurality of global bit lines in response to a second switch control signal,
   wherein opposing first and second ends of the plurality of resistive memory cells connected between the write driver and the ground line are disconnected from the write driver and the ground line in response to the first and second switch control signals.

2. The resistive memory device of claim 1, wherein, after the first and second ends of the plurality of resistive memory cells are disconnected from the write driver and the ground line, the second switch is turned ON to discharge the plurality of local bit lines to voltages of the plurality of global bit lines.

3. The resistive memory device of claim 2, wherein, after the second switch is turned ON, the first switch is turned ON and the second switch is then turned OFF to discharge the plurality of word lines to a voltage of the ground line.

4. The resistive memory device of claim 1, further comprising:
   a timing controller that adjusts a timing skew between an externally provided command and a delayed command, the delayed command being a temporally delayed version of the externally provided command; and
   a state machine that generates the first and second switch control signals based on the externally provided command and the delayed command.

5. The resistive memory device of claim 4, wherein the timing controller comprises:
   an electrical fuse that provides a selection signal and an inverted selection signal; and
   a timing generator that selectively delays the externally provided command and provides the delayed command according to the selection signal and the inverted selection signal.

6. The resistive memory device of claim 5, wherein the timing generator comprises:
   a pass gate being activated/deactivated according to the selection signal and the inverted selection signal; and
   at least one delay unit that delays the externally provided command and provides the delayed command in response to the activated/deactivated pass gate.

7. The resistive memory device of claim 1, wherein the plurality of resistive memory cells are phase change memory cells.

8. A memory system comprising:
   a resistive memory device; and
   a processor that controls operation of the resistive memory device,
   wherein the resistive memory device comprises:
   a memory cell array including a plurality of resistive memory cells arranged in accordance with a plurality of local bit lines, and each being respectively connected to one of a plurality of global bit lines and a plurality of word lines; and
   a write driver that selectively supplies current to the plurality of resistive memory cells corresponding to the plurality of local bit lines, via the plurality of global bit lines,
   wherein the memory cell array comprises:
   a plurality of first switches that connect the plurality of word lines to a ground line in response to a first switch control signal, and a plurality of second switches that connect the plurality of global bit lines to the plurality of local bit lines corresponding to the plurality of global bit lines in response to a second switch control signal,
   wherein first and second ends of the plurality of resistive memory cells connected between the write driver and the ground line are disconnected from the write driver and the ground line according to the first and second switch control signals.

9. The memory system of claim 8, wherein, after the first and second ends of the plurality of resistive memory cells are disconnected from the write driver and the ground line, the second switch is turned ON to discharge the plurality of local bit lines to voltages of the plurality of global bit lines, and
   wherein, after the second switch is turned ON, the first switch is turned ON and the second switch is then turned OFF to discharge the plurality of word lines to a voltage of the ground line.

10. The memory system of claim 8, wherein the resistive memory device further comprises:
- a timing controller that adjusts a timing skew between an externally provided command and a delayed command, the delayed command being a temporally delayed version of the externally provided command; and
- a state machine that generates the first and second switch control signals based on the externally provided command and the delayed command.

11. The memory system of claim 10, wherein the timing controller comprises:
- an electrical fuse that provides a selection signal and an inverted selection signal; and
- a timing generator that selectively delays the externally provided command and provides the delayed command according to the selection signal and the inverted selection signal.

12. The memory system of claim 11, wherein the timing generator comprises:
- a pass gate being activated/deactivated according to the selection signal and the inverted selection signal; and
- at least one delay unit that delays the externally provided command and provides the delayed command in response to the activated/deactivated pass gate.

13. The memory system of claim 8, wherein the plurality of resistive memory cells are phase change memory cells.

14. A method of operating a resistive memory device including a plurality of resistive memory cells arranged at intersections of a plurality of local bit lines each being connected to one of a plurality of global bit lines and a plurality of word lines, the method comprising:
- forming a current path from a write driver to the plurality of resistive memory cells and then to a ground line by supplying a current to a global bit line and a local bit line corresponding to a resistive memory cell selected from among the plurality of resistive memory cell by using the write driver; and then,
- disconnecting first and second ends of the plurality of resistive memory cells from the write driver and the ground line.

15. The method of claim 14, wherein disconnecting the first and second ends of the plurality of resistive memory cells from the write driver and the ground line comprises simultaneously disconnecting the first and second ends of the plurality of resistive memory cells from the write driver and the ground line in response to a first switch control signal and a second switch control signal.

16. The method of claim 15, further comprising:
- after disconnecting the first and second ends of the plurality of resistive memory cells from the write driver and the ground line, turning a second switch ON that operates in response to the second switch control signal to discharge the plurality of local bit lines to voltages of the plurality of global bit lines; and then,
- turning a first switch ON that operates in response to the first switch control signal; and then,
- turning the second switch OFF to discharge the plurality of word lines to a voltage of the ground line.

17. The method of claim 16, wherein the disconnecting the first and second ends of the plurality of resistive memory cells from the write driver and the ground line comprises adjusting a timing skew between the first switch control signal and the second switch control signal based on selection signals received from an electrical fuse, and disconnecting the first and second ends of the plurality of resistive memory cells from the write driver and the ground line in response to the adjusted timing skew.

18. The method of claim 14, wherein the plurality of resistive memory cells are phase change memory cells.

* * * * *